ELECTRONIC SWITCH CONTROL CIRCUIT

Filed Oct. 21, 1963

William E. Owen
INVENTOR.

BY John D. Graham 3,253,161

ELECTRONIC SWITCH CONTROL CIRCUIT

William E. Owen, Baton Rouge, La., assignor to Texas Instruments Incorporated, Dallas, Tex., a corporation of Delaware Filed Oct. 21, 1963, Ser. No. 317,668
4 Claims. (Cl. 307—88.5)

This invention relates to switching devices and circuits, and more particularly to a circuit arrangement for driving a transistor switch.

It is common in low-level switching applications to connect the collector-emitter current paths of two transistors in series between a signal source and a load, the transistors being connected in opposition to cancel the collector-emitter voltage drops, and simultaneously driven into either saturation or cutoff to close or open the switch, respectively. The base current for the transistors is ordinarily supplied by a transformer coupling arrangement which serves to isolate the transistors from ground and from the driving source. However, switching applications which require isolation are not compatible with transformers in the integrated circuit approach to microminiaturization, wherein all of the elements of a circuit are formed in or on a wafer of semiconductor material.

It is therefore the principal object of this invention to provide a transistorized switching circuit which does not utilize unwieldy components such as transformers, yet permits isolation of the signal circuit from ground and from the driving circuit while the switch is closed. Another object of the invention is a transistorized switching circuit adapted for construction in a semiconductor network or integrated circuit. An additional object is to provide an improved translating circuit wherein the output is isolated from the input during a portion of the operating cycle.

In accordance with this invention, a driving circuit adapted for use in a transistorized switch preferably utilizes a capacitor and diode arrangement to permit the capacitor to be charged while the switch is open, and to saturate the transistors or close the switch by discharging the capacitor while the switch is isolated from the driving source by reverse-biased diodes. In one embodiment of the invention, a constant current device in the discharge path of the capacitor provides a constant level of transistor saturation while the switch is closed.

The novel features believed to be characteristic of the invention are set forth in the appended claims. The invention itself, however, along with further objects and advantages thereof, may be best understood by reference to the following detailed description of an illustrative embodiment, when read in conjunction with the accompanying drawing, wherein:

Figure 1:
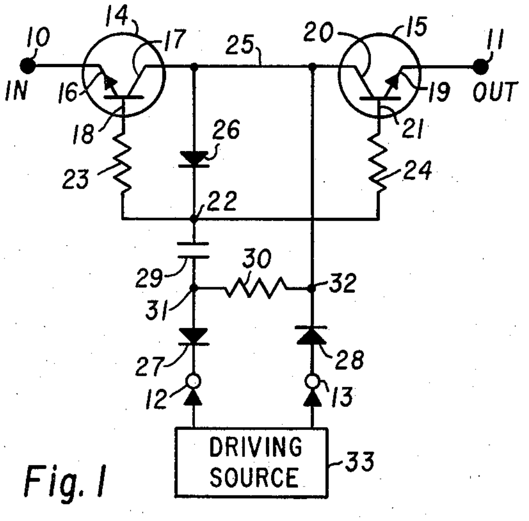
FIGURE 1 is a schematic diagram of a switching circuit incorporating the principal features of the invention.

With reference to FIGURE 1, the circuit is adapted to either open or close the path between the input terminal 10 and the output terminal 11 in response to a driving voltage applied across the terminals 12 and 13. A pair of like NPN transistors 14 and 15 are utilized, with the transistor 14 having an emitter 16, a collector 17 and a base 18; the transistor 15 having an emitter 19, a collector 20 and a base 21. The bases of the two transistors are connected to a terminal 22 through like resistors 23 and 24 which, being substantially larger than the base resistances, equalize the driving currents. The collectors 17 and 20 are connected by a conductor 25, and this conductor is shunted to the terminal 22 by a diode 26. The diode is electrically oriented to allow the terminal 22 to be driven positive with respect to conductor 25, causing the transistors 14 and 15 to be turned on by collector-base bias; however, diode 26 conducts heavily when the conductor 25 is positive with respect to the terminal 22.

The switch described thus far would ordinarily be driven by a pulse transformer connected between conductor 25 and terminal 22, but according to this invention a driving circuit is provided that uses only components which can be incorporated into integrated circuit devices. Thus, terminals 12 and 13 are connected to the switch input by a pair of diodes 27 and 28 along with a capacitor 29 and a resistor 30 which shunts a pair of terminals 31 and 32.

Figure 2:
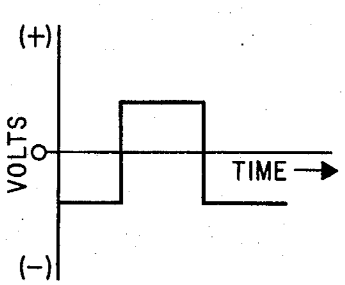
FIGURE 2 is a graphic representation of the voltage waveform supplied by the driving source of FIGURE 1.

In the operation of the circuit illustrated in FIGURE 1, a driving source 33, which may be a conventional multivibrator, applies a rectangular waveform (as seen in FIGURE 2) to the terminals 12 and 13. When the terminal 13 is positive with respect to the terminal 12, capacitor 29 will be charged through a path including diode 28, conductor 25, diode 26 and diode 27. Capacitor 29 will thus be charged such that the terminal 22 becomes positive with respect to terminal 31. When the voltage across terminals 12 and 13 reverses in polarity, diodes 27 and 28 will both be reverse-biased, thus isolating the source 33 from the switching circuit. Capacitor 29 will then discharge through the two parallel paths provided by the collector-base junctions of the transistors, the discharge rate being controlled by resistor 30.

Figure 3:
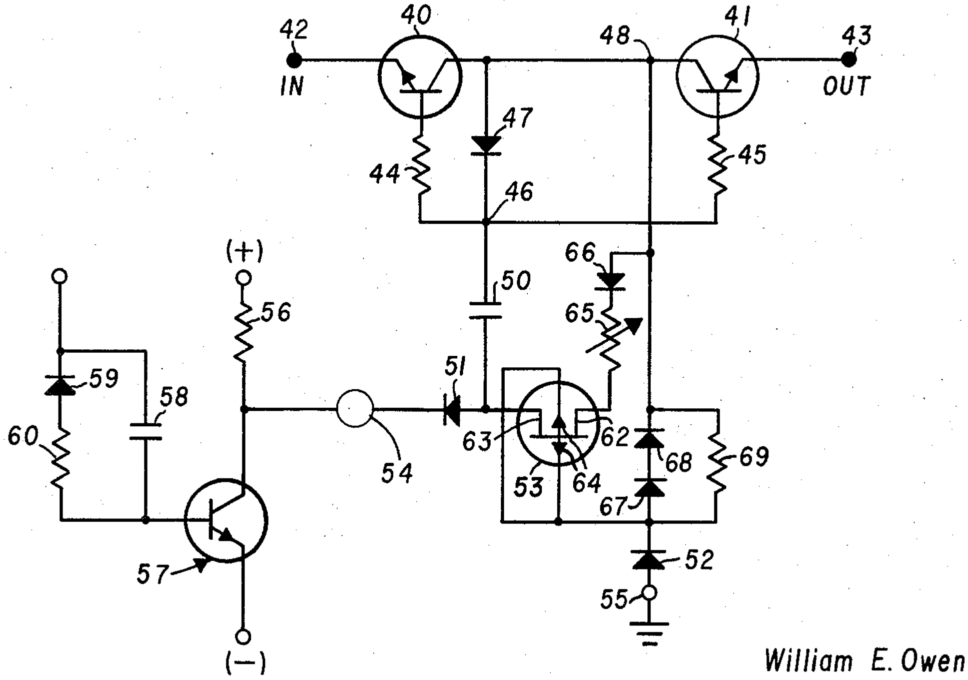
FIGURE 3 is a schematic diagram of another embodiment of the invention.

With reference to FIGURE 3, a circuit is illustrated which uses a constant current arrangement in place of the resistor 30 of FIGURE 1. This permits the capacitor 50 in the driving circuit of FIGURE 3 to discharge with constant current rather than exponentially decaying current. The switch portion of FIGURE 3 is substantially the same as that of FIGURE 1, and includes a pair of opposed, like NPN transistors 40 and 41 connected in series between an input terminal 42 and an output terminal 43. A pair of like resistors 44 and 45 connect the bases of the transistors to a terminal 46, while a diode 47 is connected between this terminal and a junction 48 common to the collectors. The driving circuit connected across terminals 46 and 48 comprises a capacitor 50, a pair of isolating diodes 51 and 52, and a constant current arrangement including a field-effect transistor 53. A rectangular-wave source is connected to a pair of terminals 54 and 55 to alternately charge the capacitor 50 and reverse-bias the diodes 51 and 52 while the capacitor discharges as described above in connection with FIGURE 1. An example of a suitable technique for driving the circuit would include the grounding of the terminal 55, as illustrated, and the application of an alternately positive and negative voltage to the terminal 54. This voltage could be derived from a collector load resistor 56 of a transistor 57 which is driven from a source of negative pulses through a reverse-biasing arrangement including a capacitor 58, a diode 59 and a resistor 60.

The constant-current feature of FIGURE 3 is provided by the circuitry associated with the field-effect transistor 53. This transistor comprises a source 62, a drain 63, and a gate terminal 64 which is connected to the gate regions on both sides of the channel. The source 62 is connected to the junction 48 through a variable resistor 65 and a diode 66, and the gate is connected to the junction 48 by a pair of diodes 67 and 68 shunted by a resistor 69.

In the operation of the circuit illustrated in FIGURE 3, the charging of capacitor 50 occurs similarly to that of capacitor 29 in FIGURE 1. When the driving source causes the terminal 54 to be negative, charging current flows in the path from the grounded terminal 55 through diodes 52, 67, 68 and 47, the capacitor 50, and diode 51. The small forward resistance of the diodes 67 and 68, compared to the size of the resistor 65, provides a source gate voltage on the field-effect transistor 53 which maintains it in a high impedance state during the charging of the capacitor. When the driving source voltage reverses polarity so that the terminal 54 becomes positive with respect to the terminal 55, capacitor 50 discharges through the parallel collector-base paths of the transistors 40 and 41, the discharge rate being kept substantially constant by the diode 66, resistor 65 and the source drain path of the field-effect transistor 53.

It is, of course, understood that various configurations of this invention may be used in addition to the illustrative embodiments above. Accordingly, even though the invention has been described with reference to particular embodiments, these descriptions are not meant to be construed in a limiting sense. Various modifications may be made by persons skilled in the art and it is contemplated that the appended claims will cover any such modifications as fall within the true scope of the invention.

What is claimed is:

1. An electronic switch control circuit comprising a plurality of diodes connected in series across a pair of terminals, said diodes being poled for conduction in the same direction, a driving source connected between said pair of terminals, a uni-directional conductive load shunting a first diode of said plurality of diodes, said unidirectional conductive load being poled for conduction in a direction opposite to that of said first diode, a capacitor interposed between said first diode and a second diode of said plurality of diodes, and a constant current discharge impedance means connected in series with said capacitor and said unidirectional load, whereby said capacitor is charged by the application of a voltage of one polarity across said pair of terminals by said driving source and discharged through said constant current discharge impedance means on the application of a voltage of opposite polarity from that of said charging voltage across said pair of terminals by said driving source, said constant current discharge impedance means causing a constant current discharge of said capacitor throughout the entire discharge period of said capacitor.

2. An electronic switch control circuit as in claim 1 wherein said unidirectional load comprises a pair of transistors and a pair of series-joined resistors, the collectors of said transistors being connected together and the bases of said transistors connected through said pair of series-joined resistors.

3. An electronic switch control circuit as in claim 1 wherein said means for causing a constant current discharge of said capacitor comprises a field effect transistor having a gate electrode, a source electrode and a drain electrode, a variable resistor and a diode, all connected in series, a pair of diodes, and a fixed resistor, said series combination being shunted by said pair of diodes in parallel with said fixed resistor.

4. An electronic switch control circuit as in claim 3 wherein said unidirectional load comprises a pair of transistors and a pair of series-joined resistors, the collectors of said transistors being connected together and the bases of said transistors being connected to said pair of series-joined resistors.

References Cited by the Examiner

UNITED STATES PATENTS

| | | | |
|---|---|---|---|
| 2,594,104 | 4/1952 | Washburn | 328—183 X |
| 2,791,688 | 5/1957 | Cutler et al. | 328—183 X |
| 2,899,571 | 8/1959 | Myers | 307—88.5 |
| 3,038,088 | 6/1962 | Rosenberg. | |
| 3,038,089 | 6/1962 | Kittrell et al. | |
| 3,053,996 | 9/1962 | Stefanov. | |
| 3,134,874 | 6/1964 | Lucas et al. | |
| 3,168,649 | 2/1965 | Meyers. | |

OTHER REFERENCES

Amelco Semiconductor Publication, Field Effect Transistors, Theory and Applications notes, No. 1, June 1962, pages 5 and 6 relied on.

ARTHUR GAUSS, *Primary Examiner.*

I. C. EDELL, *Assistant Examiner.*